United States Patent
Yuh et al.

(10) Patent No.: US 11,688,481 B2
(45) Date of Patent: Jun. 27, 2023

(54) SEMICONDUCTOR MEMORY DEVICES WITH DIODE-CONNECTED MOS

(71) Applicant: Taiwan Semiconductor Manufacturing Company Ltd., Hsinchu (TW)

(72) Inventors: Perng-Fei Yuh, Hsinchu (TW); Tung-Cheng Chang, Xihu Township (TW); Gu-Huan Li, Zhubei (TW); Chia-En Huang, Xinfeng Township (TW); Jimmy Lee, Hsinchu (TW); Yih Wang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 17/484,730

(22) Filed: Sep. 24, 2021

(65) Prior Publication Data
US 2022/0328116 A1    Oct. 13, 2022

Related U.S. Application Data

(60) Provisional application No. 63/172,388, filed on Apr. 8, 2021.

(51) Int. Cl.
*G11C 17/16* (2006.01)
*G11C 17/18* (2006.01)
*H10B 20/20* (2023.01)

(52) U.S. Cl.
CPC .............. *G11C 17/16* (2013.01); *G11C 17/18* (2013.01); *H10B 20/20* (2023.02)

(58) Field of Classification Search
CPC ...................................................... G11C 17/16
USPC ............................................................ 365/96
See application file for complete search history.

(56) References Cited

U.S. PATENT DOCUMENTS

| | | | |
|---|---|---|---|
| 7,031,182 B2 * | 4/2006 | Beigel ................ | G06K 19/0701 365/105 |
| 2015/0016198 A1 * | 1/2015 | Wu ..................... | H03K 3/35613 327/333 |
| 2021/0319827 A1 * | 10/2021 | Marr ................... | G11C 11/4078 |

* cited by examiner

*Primary Examiner* — Muna A Techane
(74) *Attorney, Agent, or Firm* — Foley & Lardner LLP

(57) ABSTRACT

A memory device and a method of operating a memory device are disclosed. In one aspect, the memory device includes a plurality of non-volatile memory cells, each of the plurality of non-volatile memory cells is operatively coupled to a word line, a gate control line, and a bit line. Each of the plurality of non-volatile memory cells comprises a first transistor, a second transistor, a first diode-connected transistor, and a capacitor. The first transistor, second transistor, first diode-connected transistor are coupled in series, with the capacitor having a first terminal connected to a common node between the first diode-connected transistor and the second transistor.

20 Claims, 14 Drawing Sheets

SEMICONDUCTOR MEMORY DEVICES WITH DIODE-CONNECTED MOS

CROSS-REFERENCE TO RELATED APPLICATION

This application claims priority to and the benefit of U.S. Provisional Application No. 63/172,388, filed Apr. 8, 2021, entitled "SYSTEM AND METHOD FOR REDUCING WRITE DISTURB IN MEMORY CELLS," which is incorporated herein by reference in its entirety for all purposes.

BACKGROUND

A one-time programmable (OTP) memory device is a type of non-volatile memory (NVM) often used for read-only memory (ROM). When the OTP memory device is programmed, it cannot be reprogrammed. Common types include electrical fuses which use metal fuses and anti-fuse which use gate dielectrics. A typical OTP memory device can be unintentionally programmed due to a high voltage stress between two terminals of a capacitor within the OTP memory device. Therefore, it is desirable to reduce the voltage stress across the capacitor except when the capacitor is being intentionally programmed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
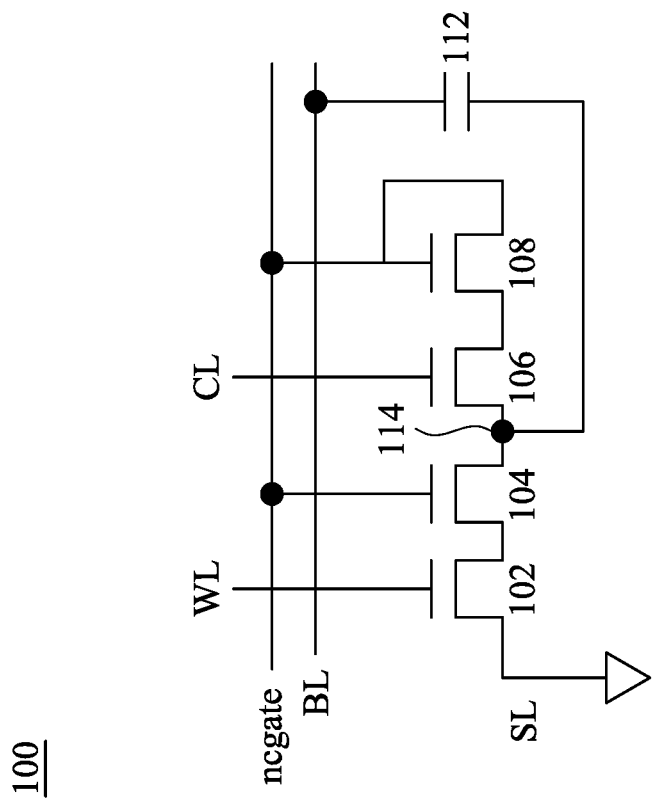
FIG. 1 illustrates an example memory cell, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A typical OTP memory device is arranged in a matrix of rows and columns of memory cells. Each memory cell within the matrix typically includes one capacitor that is used to store a datum and two transistors that are used for controlling the memory cell, specifically writing the datum to the capacitor and/or reading the datum from the memory cell. One issue with the structure of the conventional memory cell is that when a neighboring cell is being accessed (using access lines such as a word line, a bit line, and a gate control line), a write disturb phenomenon can occur which causes a large voltage drop across the storage capacitor of the neighboring cell. This phenomenon can cause the capacitor to break down and create a conductive path between the terminals, thereby causing the memory cell to be corrupted.

For example, two adjacent memory cells can share at least one of a bit line, a gate control line, or a word line. In order to select the first memory cell, voltages of the bit line, word line, and gate control line are set to predetermined voltages. The second memory cell will still receive one or more of the predetermined voltages (e.g., gate control line or bit line are shared and receive the same predetermined voltages), even though the second memory cell is not intended to be selected (e.g., the word line for the first memory cell is the predetermined voltage but the word line for the second memory cell is set to 0V). At the same time, the storage capacitor, which has a first terminal connected to the shared bit line and a second terminal connected to a select line (tied to 0V), a leakage current can flow between the second terminal of the storage capacitor and the select line. This can cause the voltage across the storage capacitor to be high, which can lead to a breakdown of the storage capacitor, effectively writing a datum in the memory cell. This write disturb can cause the memory cell to be corrupted or irreparably damaged and render the memory device unusable. Accordingly, there is a need to ensure that the write disturb phenomenon does not cause unintentional, large voltage drops in the memory cells.

In the present disclosure, a memory device can have a reduced voltage drop across the capacitor within memory cells when the memory cell is not selected, thereby advantageously reducing the probability that the capacitor in the memory cell will break down. Each memory cell can include a metal-oxide-semiconductor (MOS) diode-connected transistor (MDT) that is controlled by a control signal. The MDT can be serially connected to word line transistors and control transistors. Furthermore, the MDT transistor can be optionally connected to additional control transistors that can help reduce the voltage drop across the capacitor even further. Because the MDT allows current to flow from one of the access lines (e.g., word line (WL), bit line (BL), gate control line, or control line (CL)) to pull up one of the terminals of the capacitor, the capacitor can advantageously not be corrupted due to any leakage current that may flow to the select line or elsewhere.

FIG. 1 illustrates an example memory cell 100, in accordance with some embodiments. The memory cell 100 includes a first transistor 102, a second transistor 104, a third transistor 106, an MDT 108, and a capacitor 112. The first to third transistors 102-106 and MDT 108 are arranged in series. The first transistor 102 is gated by a word line WL, the second transistor 104 and the MDT 108 are gated by a gate control line (sometimes referred to as "ncgate line"), and the third transistors is gated by a control line CL. The first transistor 102 is connected to a select line SL.

Although a certain number of transistors and other electronic devices are shown in FIG. 1 and the remaining figures, embodiments are not limited thereto, and there can be more or fewer devices within the scope of the present disclosure. Furthermore, although FIG. 1 illustrates the transistors being an n-type transistor, embodiments are not limited thereto. In this disclosure, examples of a transistor include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. Furthermore, although the memory cells in this disclosure refer to OTP memory devices, embodiments are not limited thereto and the disclosed technology can be applied to any other type of NVM device (e.g., magnetoresistive random access memory (MRAM), resistive random access memory (ReRAM), etc.).

In operation, a user may wish to access a neighboring cell of the memory cell 100 (e.g., a cell in the same row but neighboring column (or the same column but neighboring row) in the memory array) by asserting the word line of the neighboring cell. The word line WL of the memory cell 100 is deasserted (e.g., set the voltage level of the word line WL to 0V, a second power voltage level VSS, or ground). However, the ncgate line and the bit line BL may be shared between the memory cell 100 and the neighboring cell. In order to select the neighboring cell, the ncgate line is asserted to a $V_{ncgate}$ voltage level. This can cause the memory cell 100 to be half-selected because the ncgate line is asserted, but the word line WL is deasserted. And because the select line SL is tied to ground, leakage current across one or more of the second transistors 102 can cause the node 114 to be pulled down to the select line SL voltage level (i.e., ground). This can cause a high voltage stress across the capacitor 112 because the first terminal is receiving a 0V while the second terminal might be receiving a high voltage in the bit line BL during a write operation of the neighboring cell.

In order to prevent the leakage current from causing the first terminal of the capacitor 112 to be tied to 0V (thereby causing any breakdown voltage difference across the capacitor 112), the third transistor 106 may be turned on. The control line CL can receive a first power supply voltage VDD (or assert the control line CL) or a second power supply voltage VSS (or deassert the control line CL). When the control line CL is asserted, the third transistor 106 can turn on and allow a current to flow from the ncgrate line to the MDT 108 to the third transistor 106 to the node 114, which is connected to the first terminal of the capacitor 112. This causes the first terminal of the capacitor 112 to be tied to $V_{ncgate}$ (the voltage of the ncgate line)-$V_{thn}$ (threshold voltage which is the voltage drop across in the MDT 108). Accordingly, during operation of the neighboring cell, the first terminal of the capacitor 112 can have a voltage of $V_{ncgate}-V_{thn}$. Accordingly, when the bit line BL is high during a write operation of the neighboring cell, the voltage stress on the capacitor 112 can be low.

Figure 2A:
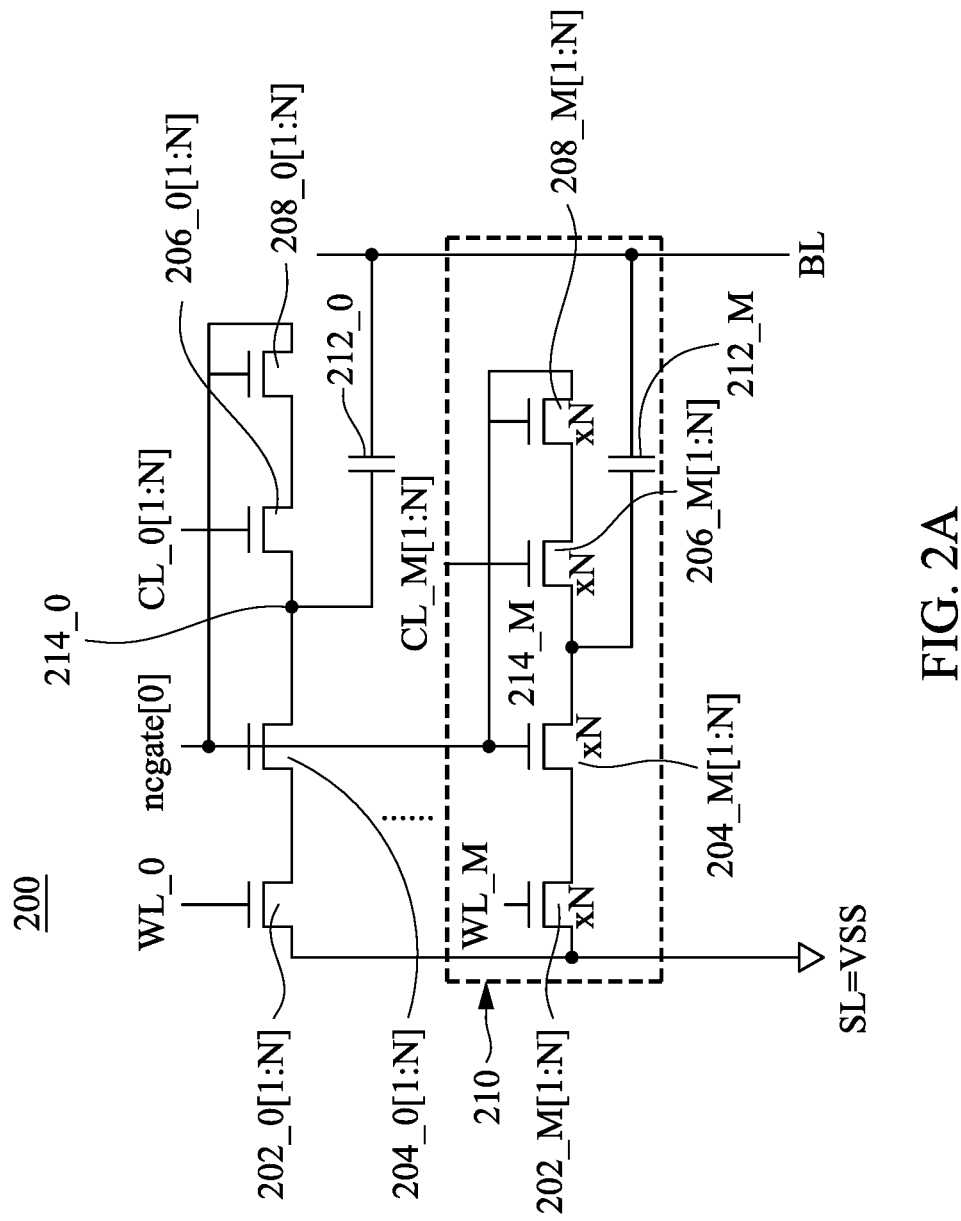
FIG. 2A illustrates a circuit diagram of a column of a plurality of memory cells, in accordance with some embodiments.

FIG. 2A illustrates a circuit diagram of a column 200 of a plurality of memory cells 210 (e.g., memory cell 100), in accordance with some embodiments. The column 200 includes one or more first transistors 202_0[1:N]-202_M[1:N] (e.g., first transistor 102 of FIG. 1), one or more second transistors 204_0[1:N]-204_M[1:N] (e.g., second transistor 104 of FIG. 1), one or more optional third transistors 206_0[1:N]-206_M[1:N] (e.g., third transistor 106 of FIG. 1), one or more MDTs 208_0[1:N]-208_M[1:N] (e.g., MDT 108 of FIG. 1), and a plurality of capacitors 212_0-212_M (e.g., capacitor 112 of FIG. 1), where M is a natural number and N is a positive integer. Generally, for each cell-row within each memory cell, the corresponding first transistor 202, the corresponding second transistor 204, the corresponding third transistor 206, and the corresponding MDT 208 are connected in series.

The column 200 includes M number of memory cells 210. Each of the first transistors 202_M[1:N] can include first and second source/drain (S/D) terminals and a gate terminal. The gate terminal can be connected to a word line WL_M of the word lines WL_0-WL_M, the first terminal can be connected to a select line SL, and the second terminal can be connected to the corresponding second transistor 204_M[1:N]. The select line SL can be connected to a ground voltage or power supply voltage VSS.

Each of the second transistors 204_M[1:N] can include first and second terminals and a gate terminal. The gate terminal can be connected to the ncgate[0] line, the first terminal can be connected to the second terminal of the corresponding first transistor 202_M[1:N], and the second terminal can be connected to a node 214_M, which is connected to the corresponding third transistor 206_M[1:N] and the capacitor 212_M.

Each of the third transistors 206_M[1:N] can include first and second terminals and a gate terminal. The gate terminal can be connected to the a corresponding control line CL_M[1:N] of the control lines C_0[1:N]-CL_M[1:N] (generally, control line CL_M), the first terminal can be connected to the node 214_M, and the second terminal can be connected to the corresponding MDT 208_M[1:N].

Each of the MDTs 208_M[1:N] can include first and second terminals and a gate terminal. The gate terminal and the second terminal can be connected to each other (i.e., diode-connected), and the first terminal can be connected to the corresponding second terminal of the corresponding third transistor 206_M[1:N]. When the third transistors 206_M[1:N] are not present, the first terminal of the MDTs 208_M[1:N] can be directly connected to the second terminal of the corresponding second transistors 204_M[1:N], with the node 214_M being located between the second transistor 204_M[1:N] and the MDT 208_M[1:N] (e.g., see FIG. 4).

The capacitor 212_M can have a first terminal that is connected to node 214_M and a second terminal that is connected to a bit line BL. The node (e.g., common node) 214_M is shared within each memory cell 210.

Figure 2B:
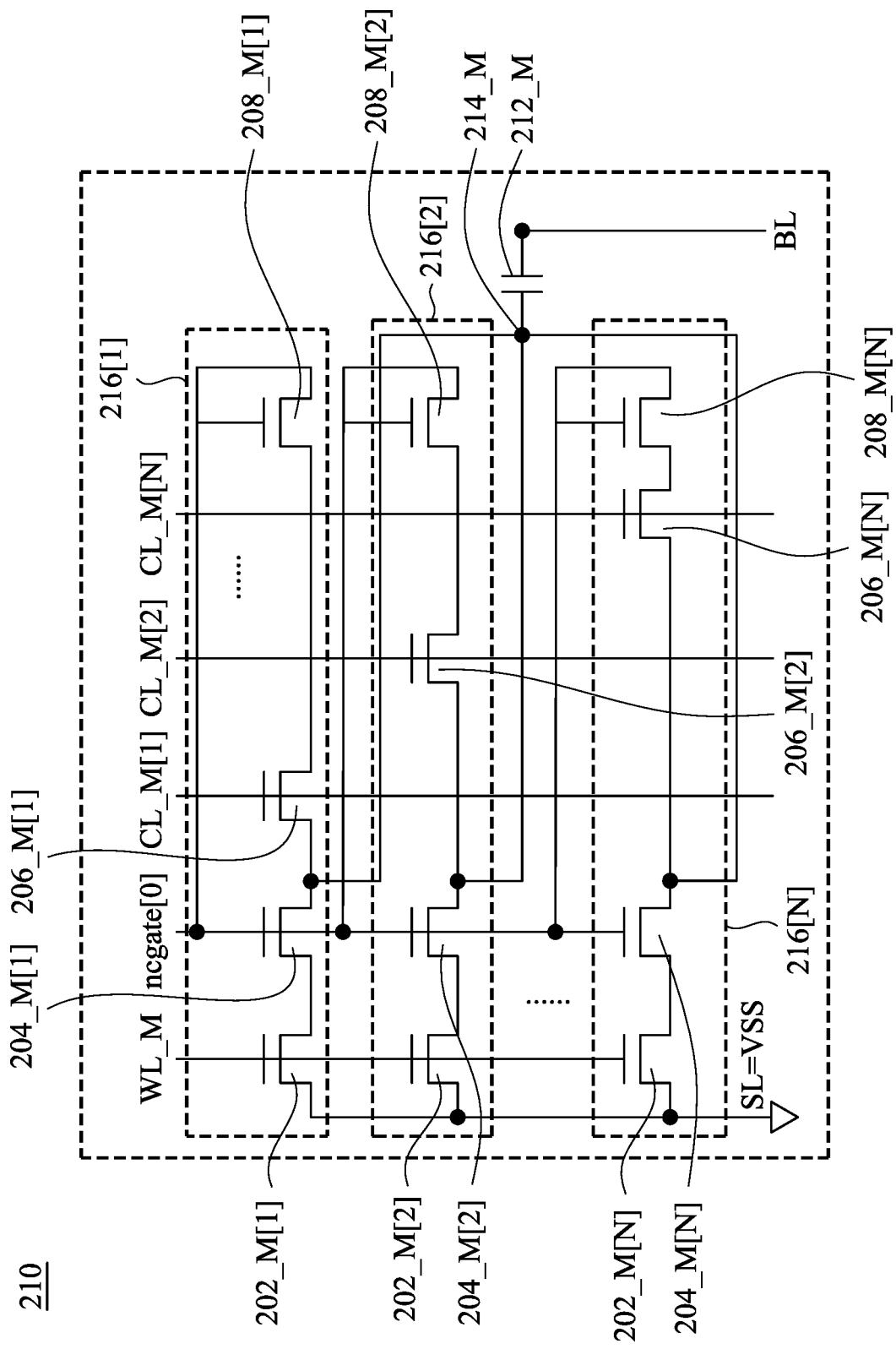
FIG. 2B illustrates a more detailed circuit diagram of the memory cell of FIG. 2A, in accordance with some embodiments.

FIG. 2B illustrates a more detailed circuit diagram of the memory cell 210 of FIG. 2A, in accordance with some embodiments. The memory cell 210 includes the $M^{th}$ memory cell of the column 200. The memory cell 210 includes only one memory cell, meaning only one datum is written into the memory cell 210 (via the capacitor 212_M).

The memory cell 210 includes a plurality of cell-rows 216[1]-216[N]. In this disclosure, a "cell-row" refers to a row of devices including the first transistor 202, the second transistor 204, the third transistor 206, and the MDT 208 within a memory cell. The cell-row is not to be confused with a row of memory cells that is included in an array of memory cells.

The cell-row 216[1] includes first transistor 202_M[1], second transistor 204_M[1], third transistor 206_M[1], and MDT 208_M[1], all connected in series. The cell-row 216[2] includes first transistor 202_M[2], second transistor 204_M[2], third transistor 206_M[2], and MDT 208_M[2], all connected in series. And the cell-row 216[N] includes first transistor 202_M[N], second transistor 204_M[N], third transistor 206_M[N], and MDT 208_M[N]. Each of the cell-rows 216[1:N] is connected to the common node 214_M and the first terminal of the capacitor 212_M, and the second terminal of capacitor 212_M is connected to the bit line BL. There can be a voltage stress level Vs across the capacitor 212_M. When the Vs is high, the capacitor 212_M may break down.

Referring to FIGS. 3A-7B, various embodiments of the present disclosure are illustrated. Specifically, FIGS. 3A, 4A, 5A, 6A, and 7A illustrate a circuit schematic of a memory cell, and FIGS. 3B, 4B, 5B, 6B, and 7B illustrate an example layout of the memory cell, respectively. However, these embodiments are not mutually exclusive, and one or more of the embodiments can be combined with others. For example, the third transistors 306_M[1:8] of FIGS. 3A-3B, which are not present in the memory cells 400, 500, 600, and 700 of FIGS. 4A-7B, can be included in the memory cells 400, 500, 600, and 700 as described above with reference to FIGS. 1-2B. Each of the layout designs 350, 450, 550, 650, 750, 850, and 950 may be used to fabricate at least a portion of a semiconductor device (e.g., an integrated circuit having a number of circuits operatively coupled to one another). Further, not all of the illustrated components are required and some embodiments of the present disclosure may include additional components not shown in FIGS. 3B, 4B, 5B, 6B, and 7B. Variations in the arrangement and type of the components may be made without departing from the scope of the present disclosure as set forth herein. Additional, different or fewer components may be included. The semiconductor device corresponding to the layout designs 350, 450, 550, 650, and 750 may be fabricated based on forming a number of transistor features/structures (e.g., channel structures, source structures, drain structures) along one or more active regions over the front side of a substrate. Furthermore, there are certain structures or layers that may not be labeled because they are not pertinent to the description of the present disclosure (e.g., dummy structures or layers).

Figure 3A:
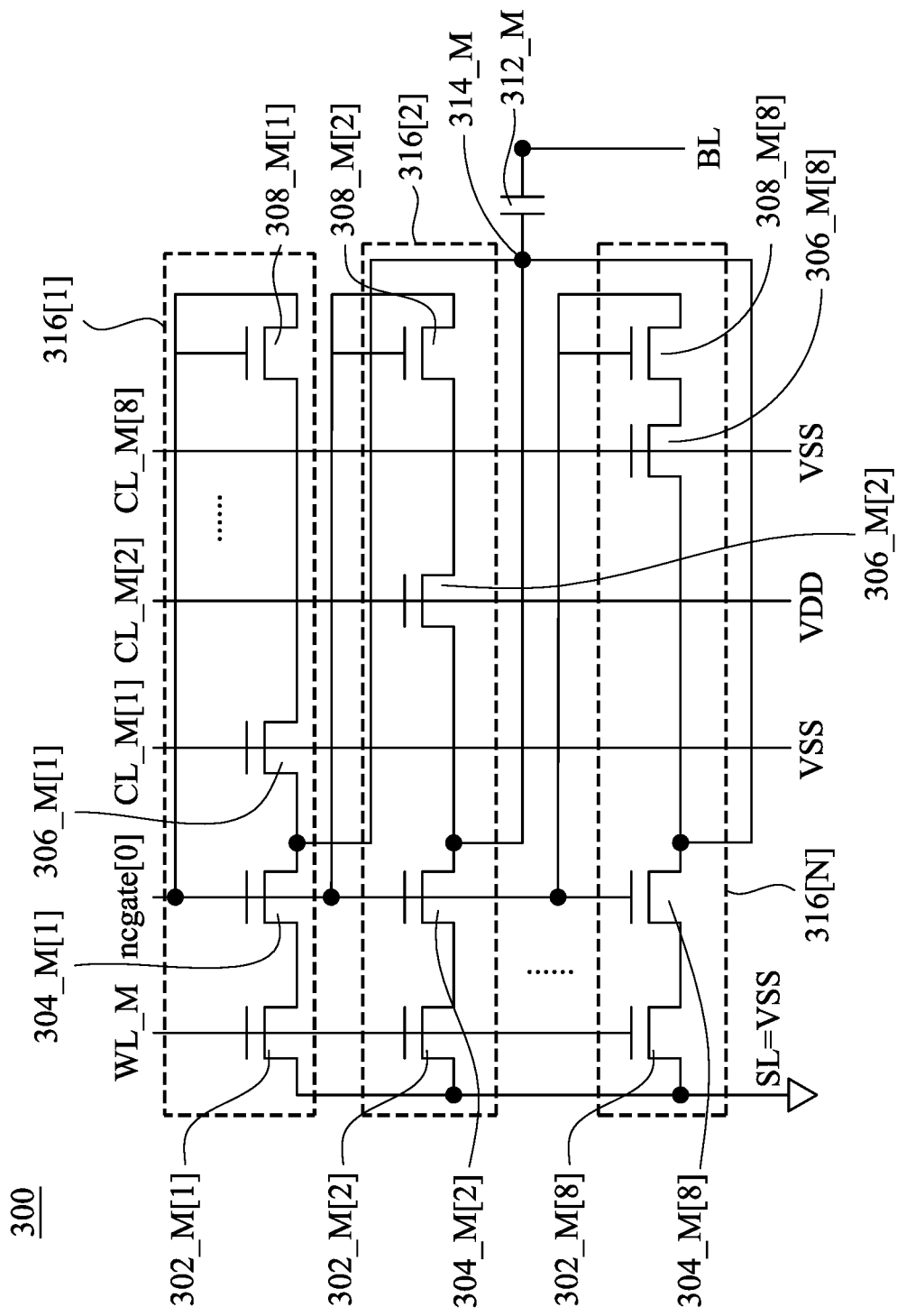
FIG. 3A illustrates a circuit schematic of an example memory cell, in accordance with some embodiments.

FIG. 3A illustrates a circuit schematic of the memory cell 300, in accordance with some embodiments. In this embodiment, N=8, meaning there are 8 third transistors 306_M, and each of these third transistors 306_M are gated by one of 8 control lines CL_M[1:8]. Accordingly, in the FIG. 3A embodiment, there are 8 cell-rows 316, and each cell-row has one first transistor 302_M, one second transistor 304_M, one third transistor 306_M, and one MDT 308_M. Although N=8 in FIG. 3A, embodiments are not limited thereto, and N being more or less than 8 is within the scope of the present disclosure.

In some embodiments, more than one of the third transistors 306_M[1:8] can be asserted at the same time. In this embodiment, there are multiple third transistors 306_M that can cause the node 314_M to be tied to $V_{ncgate}-V_{thn}$, thereby reducing the amount of voltage stress on the capacitor 312_M. In some embodiments, all of the third transistors 306_M[1:8] can be asserted at the same time, so that the voltage stress on the capacitor 312_M is the lowest when there N=8.

Figure 3B:
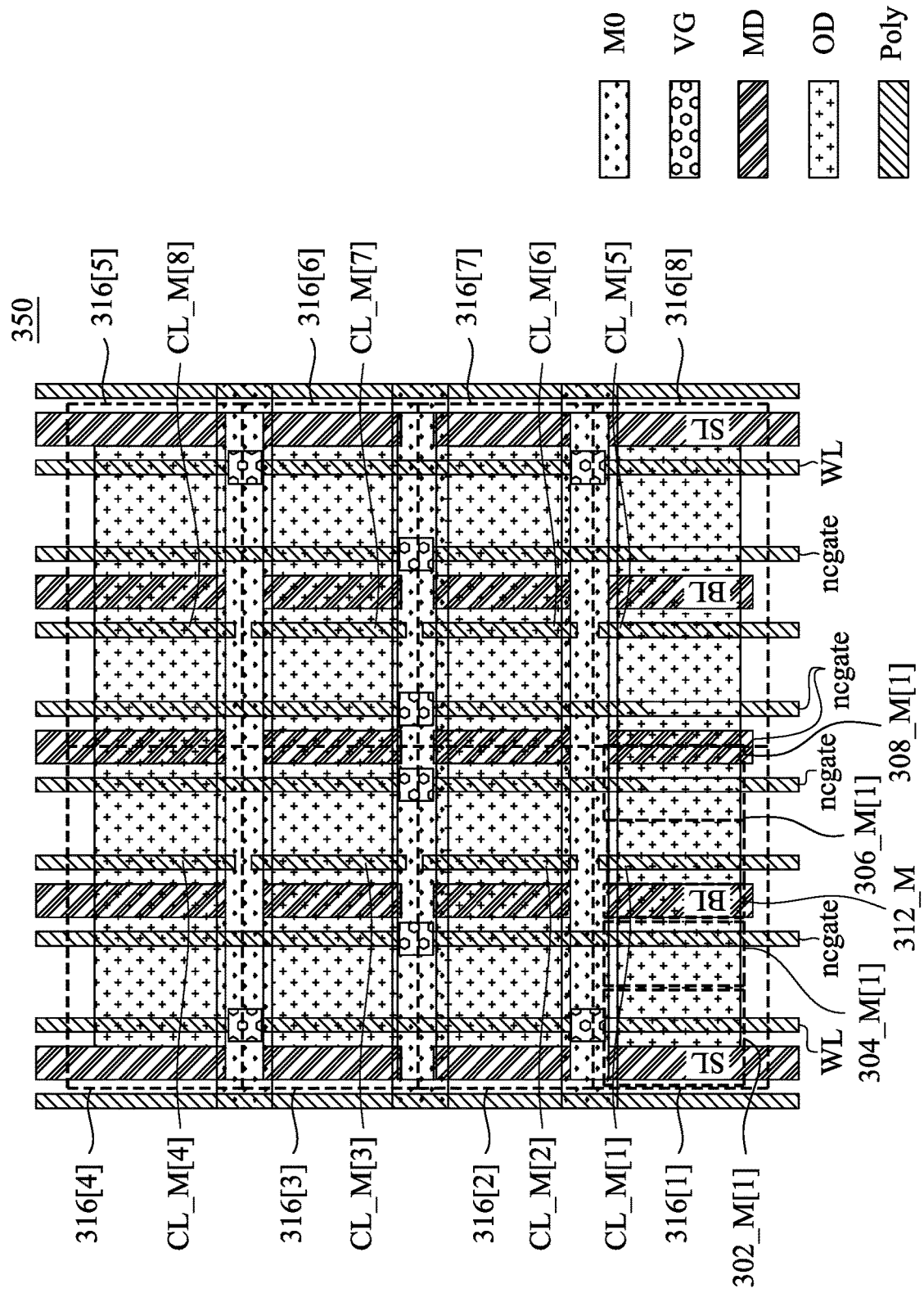
FIG. 3B illustrates a layout design of the memory cell of FIG. 3A, in accordance with some embodiments.

FIG. 3B illustrates a layout design 350 of the memory cell 300, in accordance with some embodiments. The layout design 350 includes cell-rows 316[1], 316[2], 316[3], 316[4], 316[5], 316[6], 316[7], and 316[8].

The layout design 350 shows metal layer M0, active region OD, gate via VG, gate metal Poly, and metal layer MD. The metal layer MD is formed connected to the transistors in the cell-rows 316[1:8]. The gate via VG connects the gate metal Poly to one of the word line WL, signal line SL, bit line BL, and ncgate line. The metal layer M0 is the layer formed over the transistors. The OD region includes the source/drain regions and the channel region formed below the gate metal Poly.

Each of the cell-rows 316[1:8] in FIG. 3B includes the select line SL, the word line WL, the ncgate line, the bit line BL, and one of the control lines CL_M[1:8]. The cell-row 316[1] (shown in a dashed box), for example, includes the first transistor 302_M[1], the second transistor 304_M[1], the third transistor 306_M[1], the MDT 308_M[1], and the capacitor 112[1] (shown in dashed boxes within the dashed box for the cell-row 316[1]).

Referring to the first transistor 302_M[1], the select line SL can be coupled to the active region OD. Accordingly, a select line driver (not shown) can drive a select line signal to the first transistor 302_M[1]. The word line WL can be formed over the active region OD with one or more layers interposed therebetween (e.g., a dielectric layer).

Referring to the second transistor 304_M[1], the negate line can be disposed over the active region OD with one or more layers interposed therebetween (e.g., a dielectric layer). The second transistor 304_M[1] includes a portion of the active region OD (e.g., first terminal of the second transistor 304_M[1]) that is connected to a portion of the active region OD that is part of the first transistor 302_M[1] (e.g., second terminal of the first transistor 302_M[1]).

Referring to the capacitor 312_M, the bit line BL functions as the second terminal of the capacitor 312_M and is formed over a portion of the active region OD with one or more layers interposed therebetween (e.g., a dielectric layer). The portions of the active region OD of the second transistors 304_M[1:8] that overlap the bit line BL can be connected to one another (e.g., the metal layer M0, which can be coupled to the active region OD, can connect the second terminals of the second transistors 304_M[1:8] to one another).

Referring to the third transistor 306_M[1], the control line CL_M[1] can be disposed over a portion of the active region OD with one or more layers interposed therebetween (e.g., a dielectric layer). The first terminal of the third transistor 306_M[1] can be connected to the first terminal of the capacitor 312_M (e.g., at node 314_M of FIG. 3A).

Referring to the MDT 308_M[1], the negate line can be disposed over a portion of the active region OD with one or more layers interposed therebetween (e.g., a dielectric layer). A portion of active region OD of the first terminal of the MDT 308_M[1] can be connected to a portion of the active region OD of the third transistor 306_M[1]. Further, the negate line can also be disposed in the metal layer MD and connect to the second terminal of the MDT 308_M[1]. Accordingly, the MDT 308_M[1] can be diode-connected by connecting both the gate terminal and the second terminal to the negate line.

Although not described in detail, one of ordinary skill recognize that the remaining cell-rows 316[2:8] can be disposed in a similar manner as the cell-row 316[1] as described above.

Figure 4A:
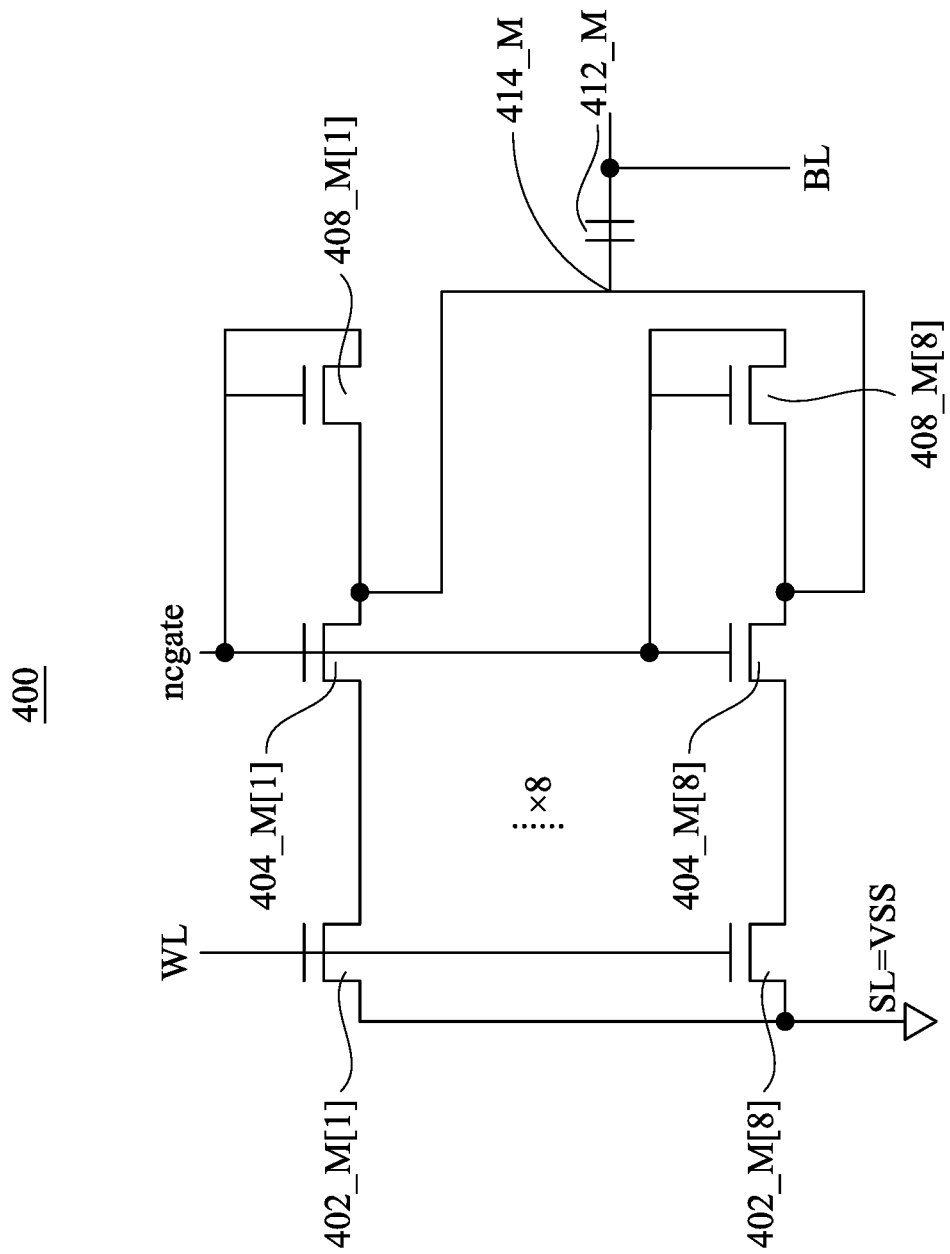
FIG. 4A illustrates a circuit schematic of another example memory cell, in accordance with some embodiments.

FIG. 4A illustrates a circuit schematic of a memory cell 400 when there are no third transistors (e.g., third transistor 106, third transistor 206_0[1:N]-206_M[1:N]), in accordance with some embodiments. Although N=8 in FIG. 4A, embodiments are not limited thereto, and N being more or less than 8 is within the scope of the present disclosure.

The memory cell 400 is similar to the memory cell 300 except that there are no third transistors. When there is no third transistor connected between the second transistor 404_M[1:8] (e.g., second transistor 304_M[1:8]) and the corresponding MDT 408_M[1:8] (e.g., MDT 308_M[1:8]), the second terminal of the second transistor 404_M[1:8] is respectively connected to the corresponding first terminal MDT 408_M[1:8]. Accordingly, a node 414_M (e.g., node 314_M) is set to a voltage level of $V_{ncgate}-V_{thn}$ by a conduction path from the ncgate line ($V_{ncgate}$) through all of the MDTs 408_M[1:8] ($V_{thn}$), and a voltage stress of the capacitor 412_M (e.g., capacitor 312_M) is low when the memory cell 400 is half-selected.

Figure 4B:
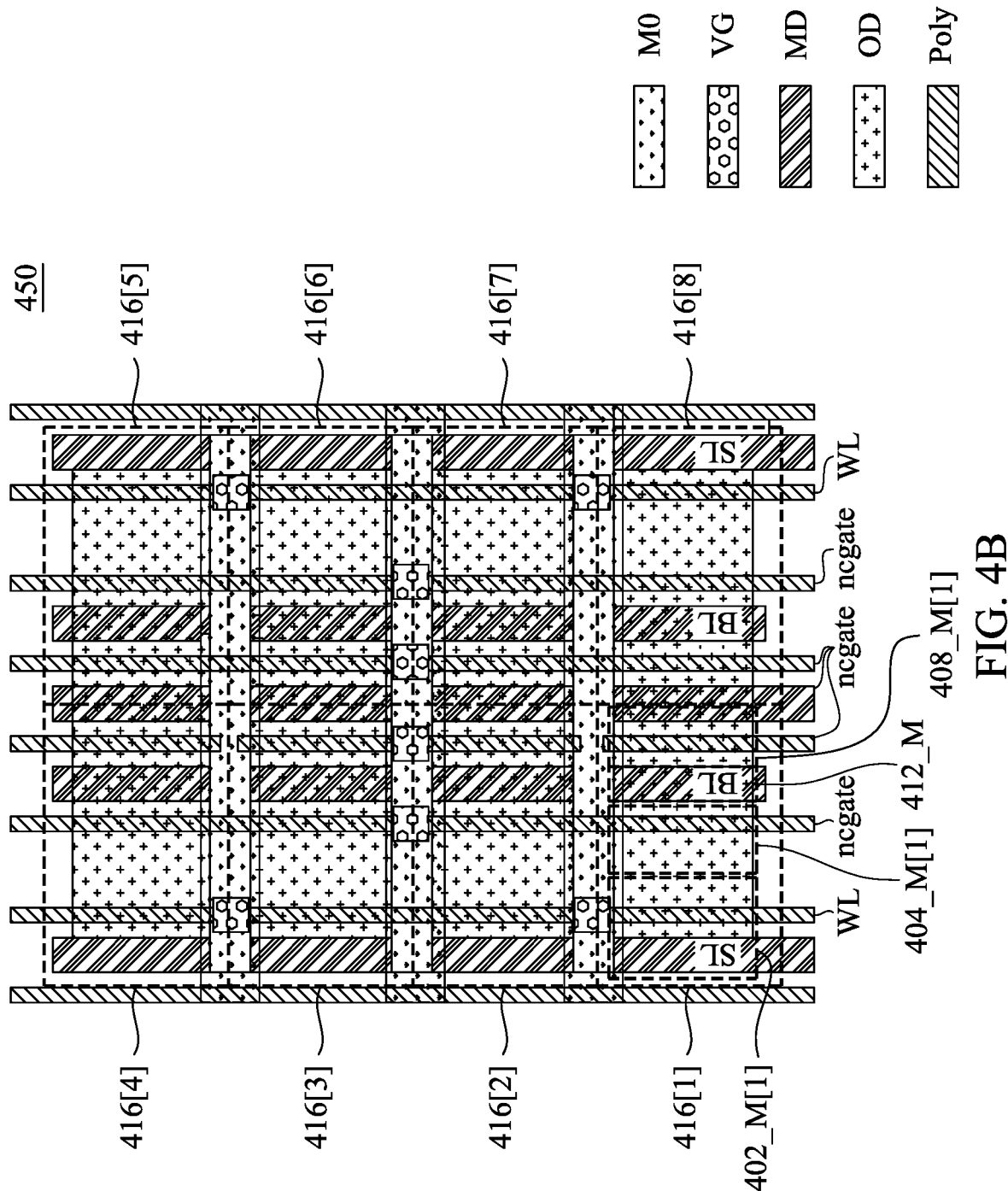
FIG. 4B illustrates a layout design of the memory cell of FIG. 4A, in accordance with some embodiments.

FIG. 4B illustrates a layout design 450 of the memory cell 400, in accordance with some embodiments. The layout design 450 includes cell-rows 416[1], 416[2], 416[3], 416[4], 416[5], 416[6], 416[7], and 416[8] (e.g., cell-rows 316[1:8]). The layout design 450 is similar to the layout design 350 except that in layout design 450, the third transistors 306_M[1:8] are not formed. Accordingly, referring to the cell-row 416[1], the first terminal of the 412_M which (a portion of the active region OD that overlaps the bit line BL) is connected to the first terminal of the MDT 408_M[1].

Figure 5A:
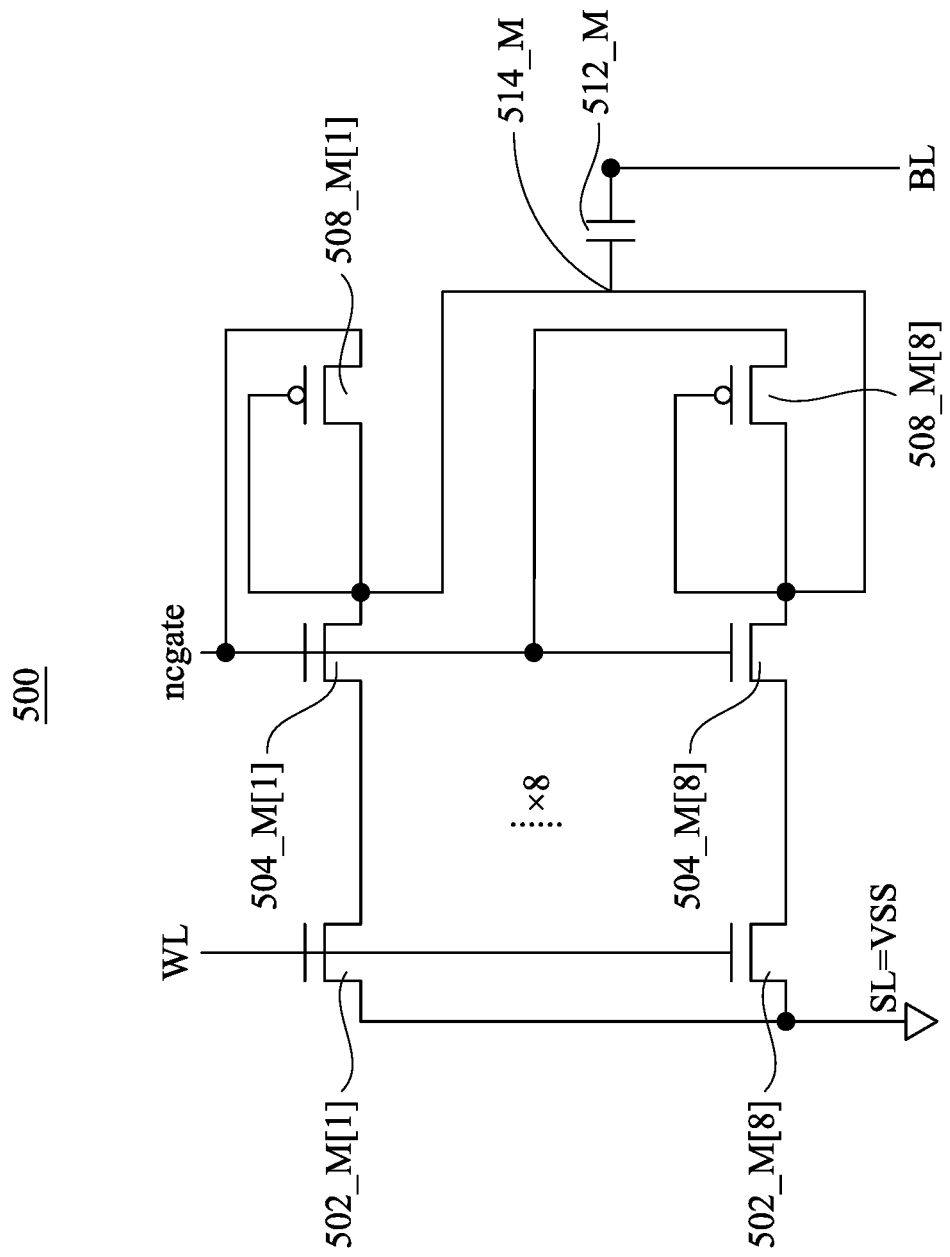
FIG. 5A illustrates a circuit schematic of another example memory cell, in accordance with some embodiments.

FIG. 5A illustrates a circuit schematic of a memory cell 500 when each of the MDTs 508_M[1:8] includes a p-type transistor, in accordance with some embodiments. In FIG. 5A, N=8 for illustration but embodiments are not limited thereto, and N can be more or less depending on embodiments. Furthermore, although FIG. 5A shows that there are no third transistors (e.g., third transistors 306_M[1:8]) that are connected, embodiments are not limited thereto, and third transistors that are gated by a control line (e.g., control lines CL_M[1:8]) can be placed in between the second transistors 504_M[1:N] and the MDTs 508_M[1:8].

The memory cell 500 is similar to the memory cell 400 except that each of the MDTs 508_M[1:8] is a p-type transistor (instead of an n-type transistor as in, e.g., memory cells 200 and 300). The MDTs 508_M[1:8] each has a first terminal, a second terminal, and gate terminal. The first terminal is connected to a node 514_M (e.g., node 414_M) which is connected to the second terminal of a second transistor 504_M[1:8] (e.g., second transistor 404_M[1:8]). The gate terminal of the MDT 508_M[1:8] is also connected to the node 514_M, making each of the MDT 508_M[1:8] a diode-connected transistor. The second terminals of the MDTs 508_M[1:8] are connected to the ncgate line.

When the MDTs 508_M[1:8] are diode-connected between the gate terminal and the first terminal, the node 514_M can be pulled up to a voltage of the $V_{ncgate}-Vthp$ (threshold voltage of the MDT 508_M[1:8]). For example, when the ncgate is $V_{ncgate}$ voltage (e.g., first power supply voltage VDD or a predetermined ncgate voltage), and the first terminal of the capacitor 512_M begins to drop, the MDT 508_M[1:8] will turn on and drive the node 514_M back up to $V_{ncgate}-Vthp$. Accordingly, the voltage stress on the capacitor 514_M will be low.

Figure 5B:
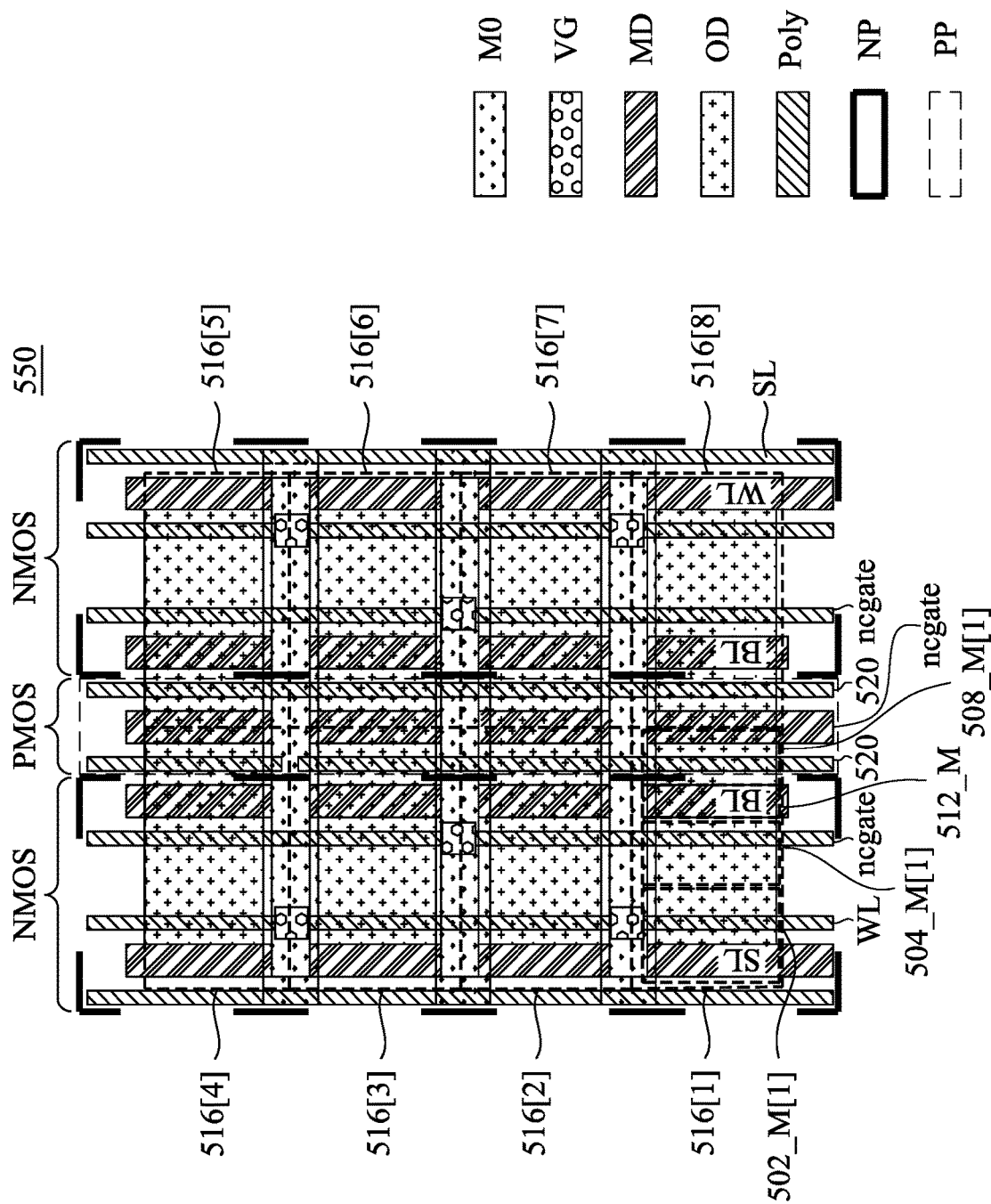
FIG. 5B illustrates a layout design of the memory cell of FIG. 5A, in accordance with some embodiments.

FIG. 5B illustrates a layout design 550 of the memory cell 500, in accordance with some embodiments. The layout design 550 includes cell-rows 516[1], 516[2], 516[3], 516[4], 516[5], 516[6], 516[7], and 516[8] (e.g., cell-rows 416[1:8]). The layout design 550 is similar to the layout design 450 except that the MDT 508_M[1:8] are p-type transistors.

A portion of the second terminal of the second transistor 504_M[1] includes a portion of the active region OD which overlaps the bit line BL that is disposed on the gate metal Poly. Accordingly, the bit line BL disposed in the metal layer MD and the portion of the second terminal of the second transistor 504_M[1] form the capacitor 512_M. Also, the gate terminals 520 of the p-type MDTs 508_M[1:8] are formed on the gate metal Poly, and the gate terminals 520 are all coupled to one another and the active region OD formed below the gate terminals 520 so that each of the MDTs 508_M[1:8] is diode-connected. And the second terminals of the MDTs 508_M[1:8] are connected to the ncgate line disposed in the metal layer MD.

Figure 6A:
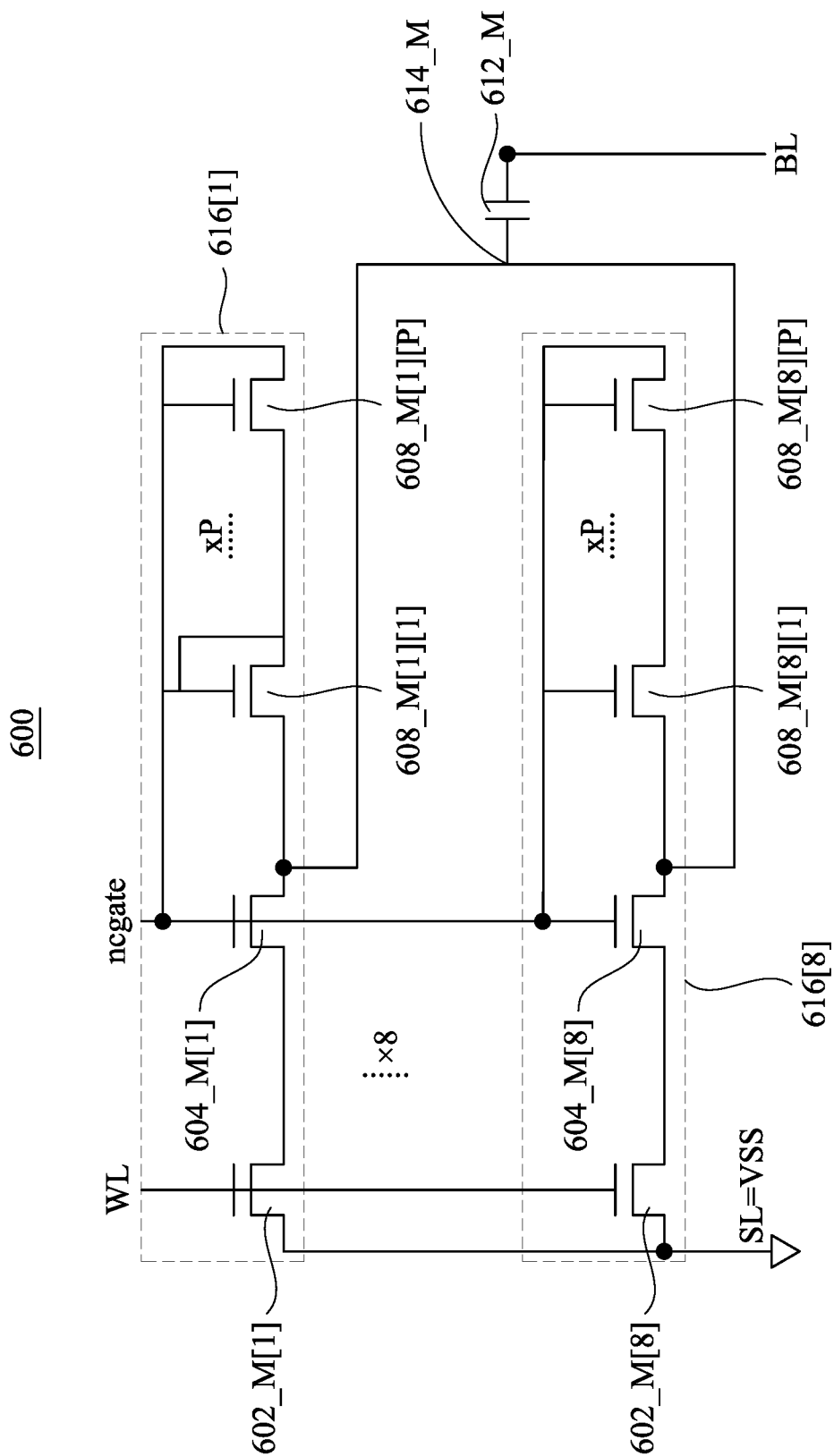
FIG. 6A illustrates a circuit schematic of another example memory cell, in accordance with some embodiments.

FIG. 6A illustrates a circuit schematic of a memory cell 600 when there are P number of MDTs 608_M[1:N][P] per cell-row, in accordance with some embodiments. In FIG. 6A, N=8 for illustration but embodiments are not limited thereto, and N can be more or less depending on embodiments. Furthermore, although FIG. 6A shows that there are no third transistors (e.g., third transistors 306_M[1:8]) that are connected, embodiments are not limited thereto, and third transistors that are gated by a control line (e.g., control lines CL_M[1:8]) can be placed in between the second transistors 604_M[1:N] and the MDTs 608_M[1:8][1] (e.g., the first MDTs that are connected to the node 614_M).

The memory cell 600 is similar to the memory cell 400 except that each of the cell-rows includes a P number of MDTs (e.g., MDT 408_M[1:8]). For example, the cell-row 616[1] includes a P number of MDTs 608_M[1][1]-608_M[1][P]. For every MDT that gets added, there is a voltage drop of Van, (or Vthp if the MDT is a p-type transistor) at the node 614_M. For example, if there are 4 MDTs 608_M[1][1]-608_M[1][4] in the cell-row 616[1], the voltage at the node 614_M is $V_{ncgate}$ (4×$V_{thn}$).

Figure 6B:
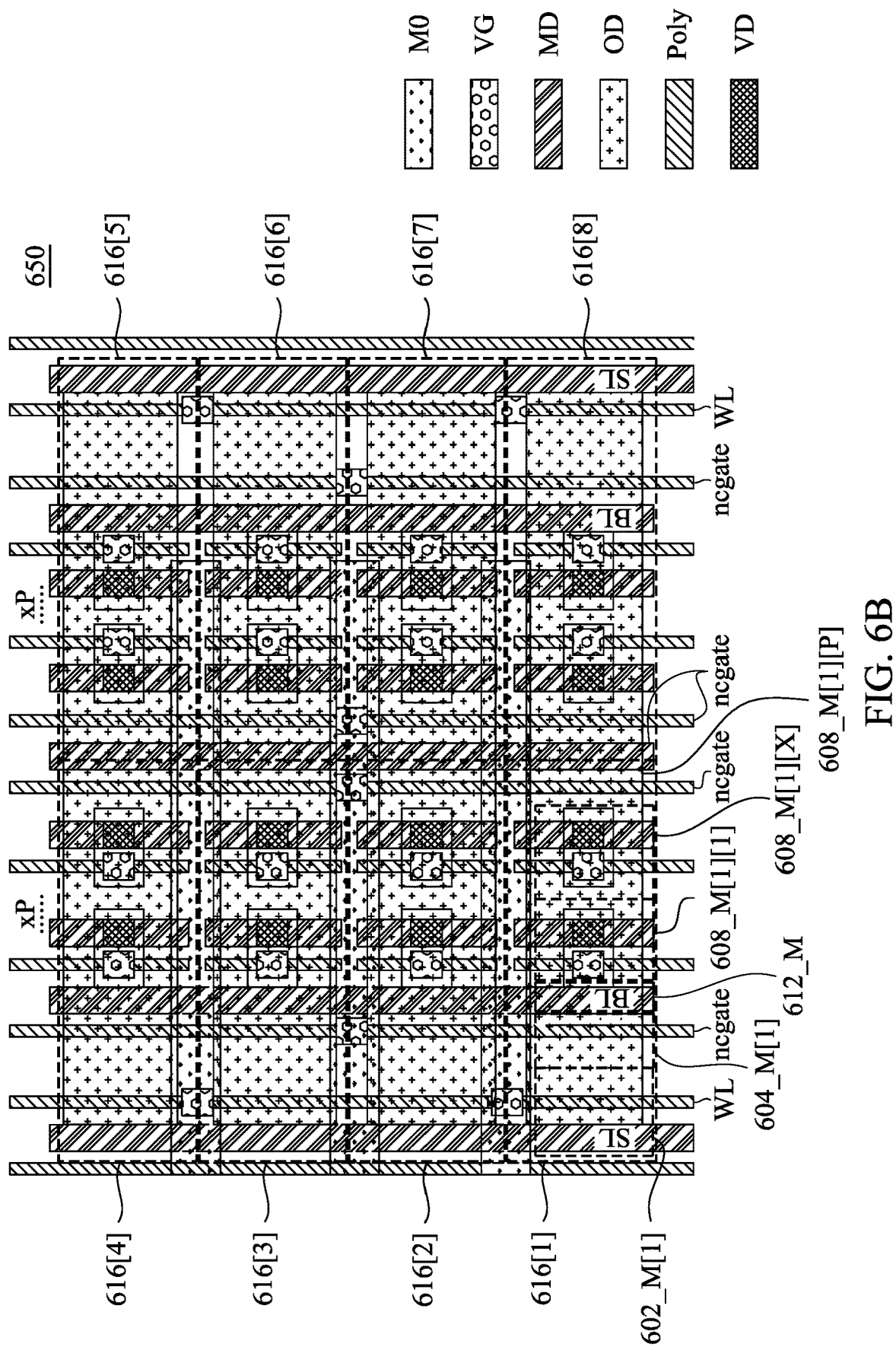
FIG. 6B illustrates a layout design of the memory cell of FIG. 6A, in accordance with some embodiments.

FIG. 6B illustrates a layout design 650 of the memory cell 600, in accordance with some embodiments. The layout design 650 includes cell-rows 616[1], 616[2], 616[3], 616[4], 616[5], 616[6], 616[7], and 616[8] (e.g., cell-rows 416[1:8]). The layout design 650 is similar to the layout design 450 except that there is a P number of portions of the layout 650 that are repeated for the P number of MDTs 608_M[1][1]-608_M[1][P].

The first terminal of the capacitor 612_M is included in a portion of the active region OD that overlaps the bit line BL that is disposed in the metal layer MD. This portion of the active region OD is connected to the MDT 608_M[1][1] which includes a gate metal Poly. The gate metal Poly is connected to a metal layer M0 through a gate via VG, and the metal layer M0 is connected to another portion of the active region OD that includes the second terminal of the MDT 608_M[1][1]. Accordingly, MDT 608_M[1][1] is diode-connected. Similar structures can be formed repeatedly to form MDT 608_M[1][X] where X is an integer between 1 and P. Then the MDT 608_M[1][P], which is the last MDT for the P MDTs in series, can have the gate terminal and the second terminal both connected to the ncgate line as shown in FIG. 6A. The MDT_608[1][P] can have the gate terminal disposed in the gate metal Poly which includes the ncgate line, and the second terminal (portion of active region OD) can be disposed in the metal layer MD includes the ncgate line as well. Accordingly, the gate terminal and the second terminal can be both connected to the ncgate line.

Figure 7A:
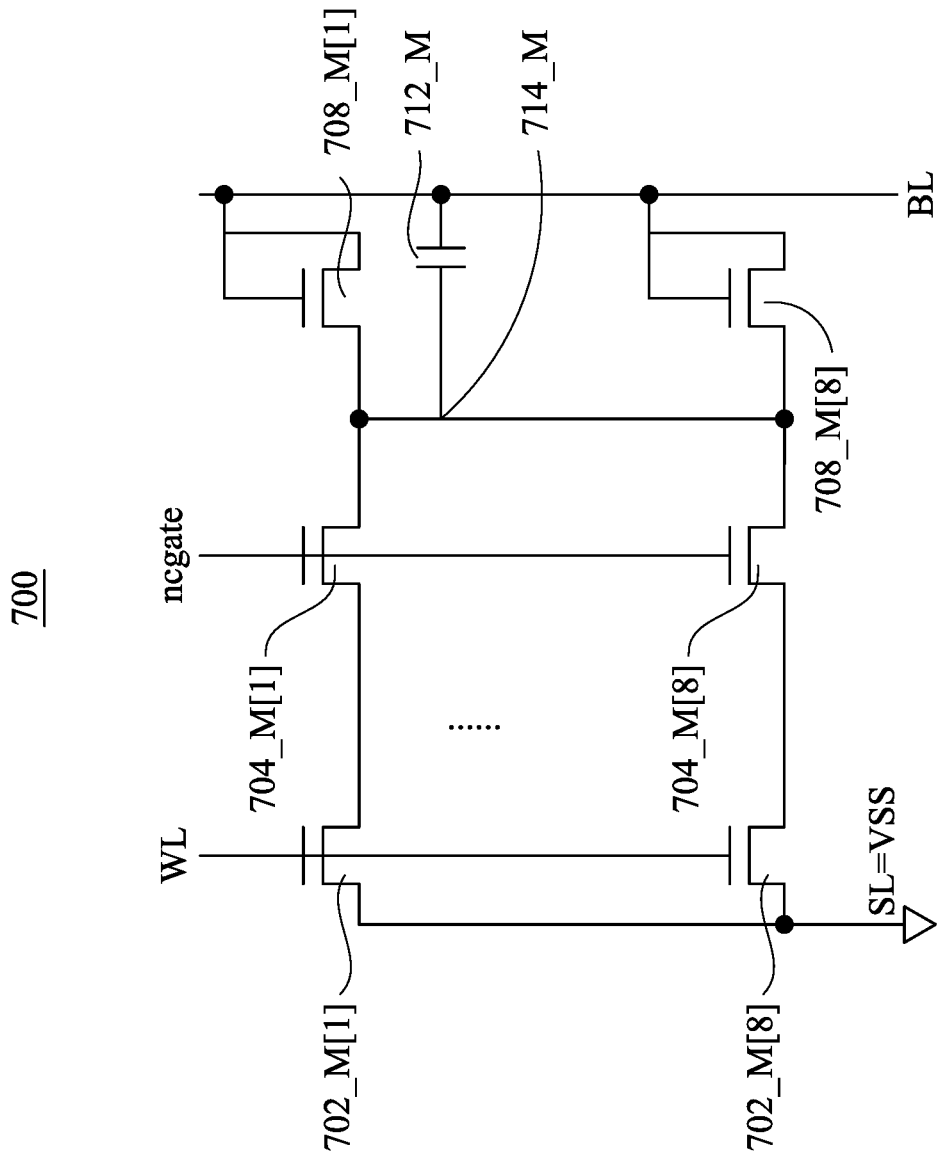
FIG. 7A illustrates a circuit schematic of another example memory cell, in accordance with some embodiments.

FIG. 7A illustrates a circuit schematic of a memory cell 700 when the MDTs are diode-connected to the bit line BL, in accordance with some embodiments. In FIG. 7A, N=8 for illustration but embodiments are not limited thereto, and N can be more or less depending on embodiments. Furthermore, although FIG. 7A shows that there are no third transistors (e.g., third transistors 306_M[1:8]) that are connected, embodiments are not limited thereto, and third transistors that are gated by a control line (e.g., control lines CL_M[1:8]) can be placed in between the second transistors 704_M[1:N] and the MDTs 708_M[1:8].

The memory cell 700 is similar to the memory cell 400 except that the MDTs 708_M[1:8] are diode-connected to the bit line BL. Accordingly, the voltage at the node 714_M can be set to $V_{BL}-V_{thn}$.

Figure 7B:
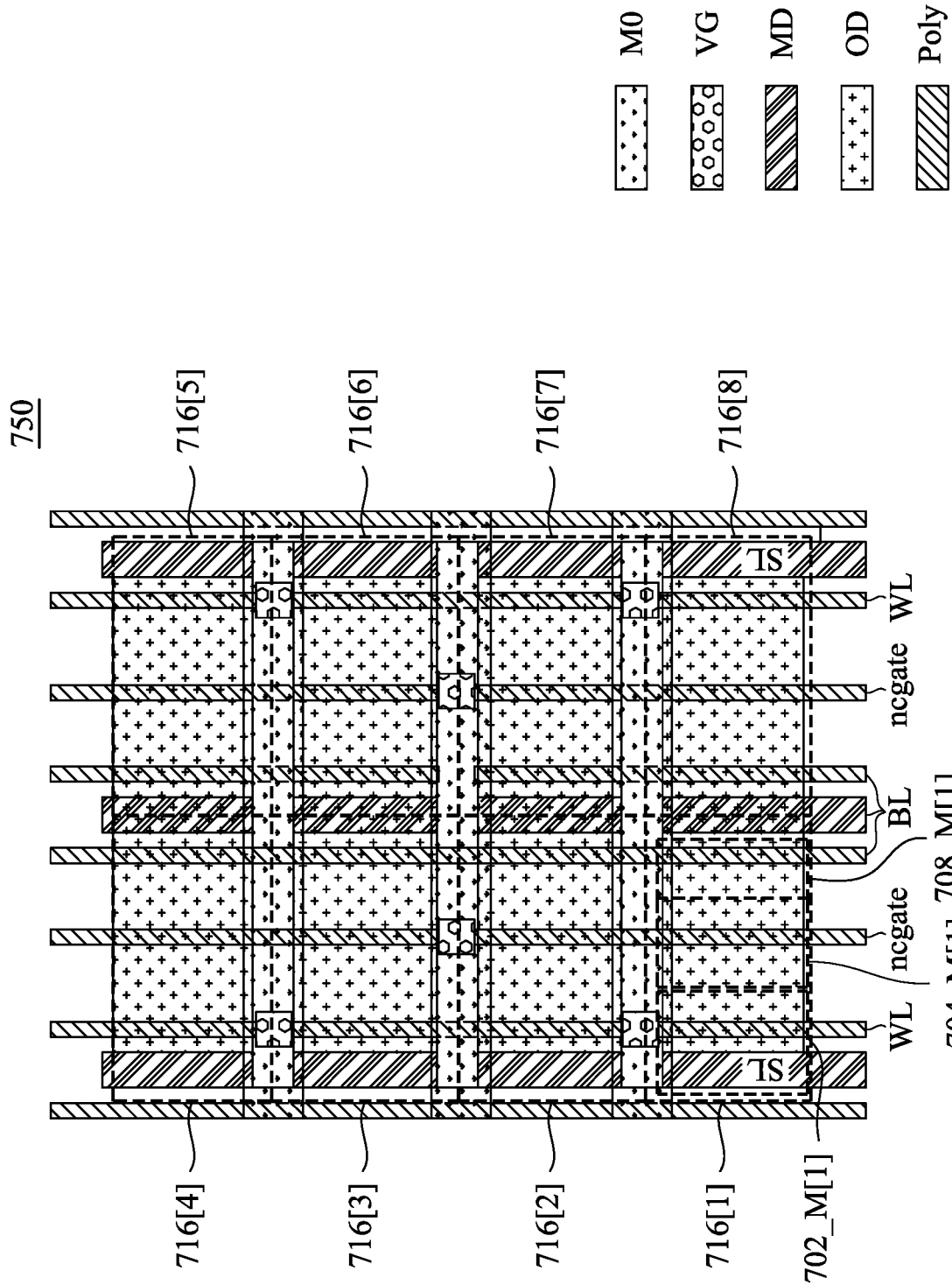
FIG. 7B illustrates a layout design of the memory cell of FIG. 7A, in accordance with some embodiments.

FIG. 7B illustrates a layout design 750 of the memory cell 700, in accordance with some embodiments. The layout design 750 includes cell-rows 716[1], 716[2], 716[3], 716[4], 716[5], 716[6], 716[7], and 716[8] (e.g., cell-rows 416[1:8]). The layout design 750 is similar to the layout design 450 except that the MDTs 708_M[1:8] are diode-connected to the bit line BL.

The bit line BL that is formed in the gate metal Poly includes the gate terminal of the MDT 708_M[1]. And a second terminal of the MDT 708_M[1], which is formed in the active region OD, overlaps the bit line BL disposed in the metal layer MD, forming the capacitor (not shown). Accordingly, the MDT 708_M[1] has a first terminal that is connected to the first terminal of the capacitor 712_M, and the MDT 708_M[1] has the gate terminal and a second terminal that are connected to the bit line BL.

Figure 8:
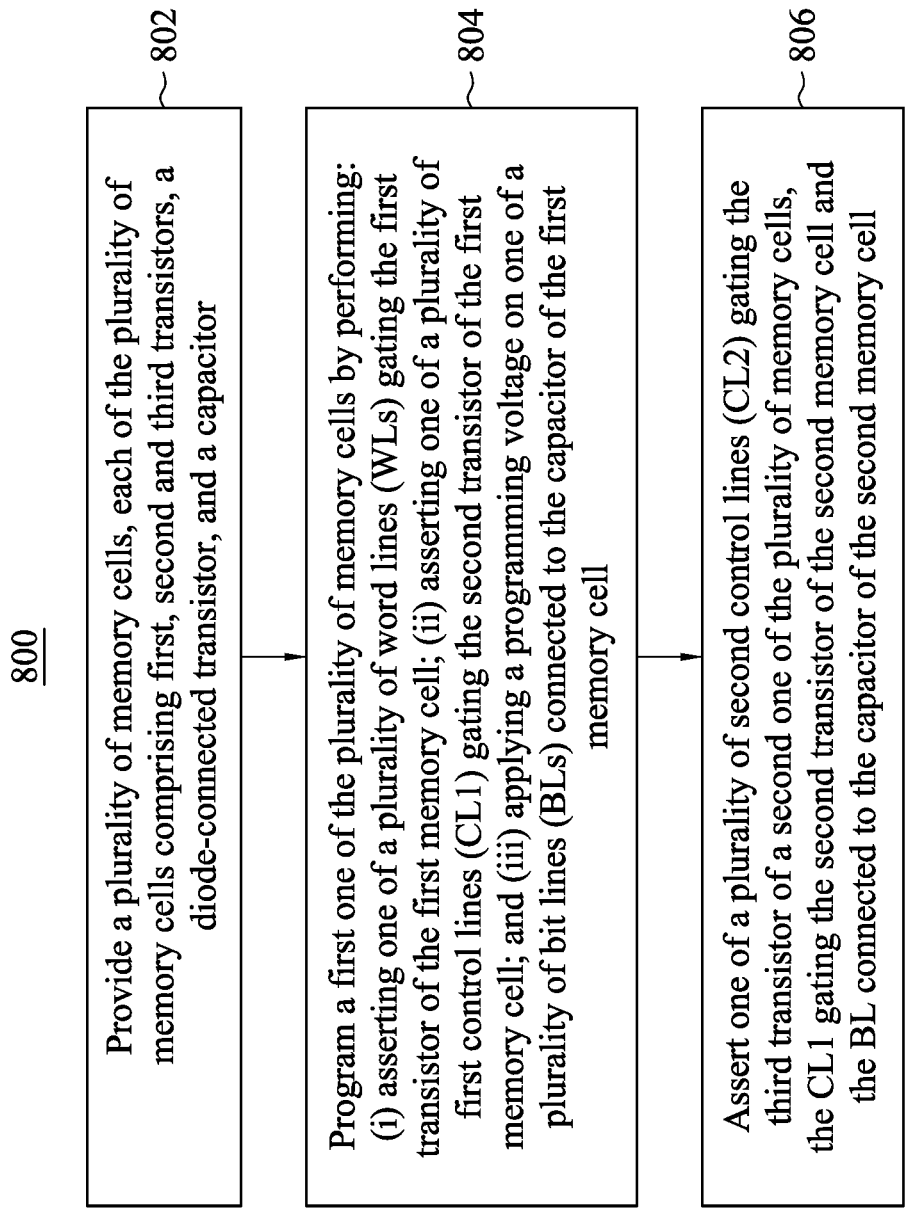
FIG. 8 illustrates a flow chart of an example process of operating an example memory device, in accordance with some embodiments.

FIG. 8 illustrates a flow chart of an example process 800 of operating an example memory device including a number of the currently disclosed memory cells (e.g., 100, 210, 300, 400, 500, 600, 700), in accordance with some embodiments. It should be noted that process 800 is merely an example and is not intended to limit the present disclosure. Accordingly, it is understood that additional steps/operations may be provided before, during, and after process 800 of FIG. 8, and that some other operations may only be briefly described herein.

In brief overview, the process 800 can start with operation 802 of providing a plurality of memory cells, each of the plurality of memory cells comprising a first transistor, a second transistor, a third transistor, a diode-connected transistor, and a capacitor. Then, process 800 can proceed to operation 804 of programming a first one of the plurality of memory cells. Then, process 800 can proceed to operation 806 of asserting one of a plurality of second control lines ($CL_2$) gating the third transistor of a second one of the plurality of memory cells, wherein the $CL_1$ also gates the second transistor of the second memory cell and the BL also connected to the capacitor of the second memory cell.

Operation 802 includes providing a plurality of memory cells (e.g., memory cell 100, 210, 300, 400, 500, 600, or 700), each of the plurality of memory cells comprising a first transistor (e.g., first transistor 102, 202_M[1:N], 302_M[1:N], 402_M[1:N], 502_M[1:N], 602_M[1:N], or 702_M[1:N]), a second transistor (e.g., second transistor 104, 204_M[1:N], 304_M[1:N], 404_M[1:N], 504_M[1:N], 604_M[1:N], or 704_M[1:N]), a third transistor (e.g., third transistor 106, 206_M[1:N], or 306_M[1:N]), a diode-connected transistor (e.g., MDT 108, 208_M[1:N], 308_M[1:N], 408_M[1:N], 508_M[1:N], 608_M[1:N], or 708_M[1:N]), and a capacitor (e.g., capacitor 112, 212_M, 312_M, 412_M, 512_M, 612_M, or 712_M). As discussed above, the third transistor may be omitted in various embodiments.

Operation 804 includes programming a first one of the plurality of memory cells by performing: (i) asserting one of a plurality of word lines (WLs) (e.g., word line WL or WL_M of FIGS. 1-7B) gating the first transistor of the first memory cell; (ii) asserting one of a plurality of first control lines ($CL_1$) (e.g., ncgate line of FIGS. 1-7B) gating the second transistor of the first memory cell; and (iii) applying a programming voltage on one of a plurality of bit lines (BLs) connected to the capacitor of the first memory cell.

Operation 806 includes asserting one of a plurality of second control lines ($CL_2$) (e.g., control line CL or CL_M[1:N] of FIGS. 1-7B) gating the third transistor of a second one of the plurality of memory cells, wherein the $CL_1$ also gates the second transistor of the second memory cell and the BL also connected to the capacitor of the second memory cell. Accordingly, a high stress voltage across the capacitor in the second memory cell can be prevented or minimized, when the second memory cell including the capacitor is not selected.

In one aspect of the present disclosure, a memory device is disclosed. The memory device includes a plurality of non-volatile memory cells, each of the plurality of non-volatile memory cells is operatively coupled to a word line (WL), a gate control line, and a bit line (BL). Each of the plurality of non-volatile memory cells comprises a first transistor, a second transistor, a first diode-connected transistor, and a capacitor. The first transistor, second transistor, first diode-connected transistor are coupled in series, with the capacitor having a first terminal connected to a common node between the first diode-connected transistor and the second transistor.

In another aspect of the present disclosure, a memory device is disclosed. The memory device includes a plurality of one-time-programmable (OTP) memory cells. Each of the plurality of OTP memory cells comprises M first transistors, M second transistors, M third transistors, M diode-connected transistors, and a capacitor, M being a positive integer. Each of the M first transistors is coupled to a respective one of the M second transistors, a respective one of the M third transistors, and a respective one of the M diode-connected transistors in series, with one terminal of the capacitor connected to a node between the respective second transistor and the respective third transistor.

In yet another aspect of the present disclosure, a method for operating a memory device is disclosed. The method includes providing a plurality of memory cells, each of the plurality of memory cells comprising a first transistor, a second transistor, a third transistor, a diode-connected transistor, and a capacitor. The method also includes programming a first one of the plurality of memory cells by performing: (i) asserting one of a plurality of word lines (WLs) gating the first transistor of the first memory cell; (ii) asserting one of a plurality of first control lines ($CL_1$) gating the second transistor of the first memory cell; and (iii) applying a programming voltage on one of a plurality of bit lines (BLs) connected to the capacitor of the first memory cell. The method further includes asserting one of a plurality of second control lines ($CL_2$) gating the third transistor of a second one of the plurality of memory cells, wherein the $CL_1$ also gates the second transistor of the second memory cell and the BL also connected to the capacitor of the second memory cell As used herein, the terms "about" and "approximately" generally mean plus or minus 10% of the stated value. For example, about 0.5 would include 0.45 and 0.55, about 10 would include 9 to 11, about 2000 would include 900 to 2200.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a plurality of non-volatile memory cells, each of the plurality of non-volatile memory cells is operatively coupled to a word line (WL), a gate control line, and a bit line (BL);
   wherein each of the plurality of non-volatile memory cells comprises a first transistor, a second transistor, a first diode-connected transistor, and a capacitor; and
   wherein the first transistor, second transistor, first diode-connected transistor are coupled in series, with the capacitor having a first terminal connected to a common node between the first diode-connected transistor and the second transistor.

2. The memory device of claim 1, wherein the first transistor is gated by the WL, the second transistor is gated by the gate control line, and the capacitor has a second terminal connected to the BL.

3. The memory device of claim 1, wherein the common node is connected to a first source/drain terminal of the first diode-connected transistor.

4. The memory device of claim 3, wherein the first diode-connected transistor is an n-type transistor, and wherein the first source/drain terminal is not connected to a gate terminal of the first diode-connected transistor, with a second source/drain terminal of the first diode-connected transistor connected to its gate terminal.

5. The memory device of claim 3, wherein the first diode-connected transistor is a p-type transistor, and wherein the first source/drain terminal is connected to a gate terminal of the first diode-connected transistor, with a second source/drain terminal of the first diode-connected transistor not connected to its gate terminal.

6. The memory device of claim 1, wherein each of the plurality of non-volatile memory cells further comprises a third transistor coupled in series between the first diode-connected transistor and the second transistor.

7. The memory device of claim 6, wherein the common node is connected to a first source/drain terminal of the third transistor, with a second source/drain terminal of the third transistor connected to the first diode-connected transistor.

8. The memory device of claim 1, wherein each of the plurality of non-volatile memory cells further comprises one or more second diode-connected transistors serially coupled to the first diode-connected transistor.

9. The memory device of claim 1, wherein a gate terminal of the first diode-connected transistor is connected to one of the BL, WL, or gate control line.

10. A method for operating a memory device, comprising:
    providing a plurality of memory cells, each of the plurality of memory cells comprising a first transistor, a second transistor, a third transistor, a diode-connected transistor, and a capacitor, wherein the first, second, third, and diode-connected transistor are coupled in series;
    programming a first one of the plurality of memory cells by performing: (i) asserting one of a plurality of word lines (WLs) that is connected to a gate terminal of the first transistor of the first memory cell; (ii) asserting one of a plurality of first control lines ($CL_1$) that is connected to a gate terminal of the second transistor of the first memory cell; and (iii) applying a programming voltage on one of a plurality of bit lines (BLs) connected to the capacitor of the first memory cell; and
    asserting one of a plurality of second control lines ($CL_2$) that is connected to a gate terminal of the third transistor of a second one of the plurality of memory cells, wherein the $CL_1$ also gates the second transistor of the second memory cell and the BL is also connected to the capacitor of the second memory cell.

11. The method of claim 10, wherein one terminal of the capacitor is connected to a node between the second transistor and the third transistor and the other terminal of the capacitor is connected to a respective one of the BLs.

12. The method of claim 10, wherein a voltage drop across the capacitor is determined based on a difference between a voltage applied to one of the $CL_1$, WL, or BL and a threshold voltage of the third transistor.

13. The method of claim 10, wherein each of the plurality of memory cells further comprises one or more second diode-connected transistors serially coupled to the diode-connected transistor.

14. The method of claim 10, wherein the diode-connected transistor is an n-type transistor having a first source/drain terminal and a second source/drain terminal, wherein the first source/drain terminal is connected to a common node between the second transistor and third transistor, and wherein the first source/drain terminal is not connected to a gate terminal of the diode-connected transistor and the second source/drain terminal is connected to its gate terminal.

15. A memory device, comprising:
    a plurality of non-volatile memory cells, each of the plurality of non-volatile memory cells comprises a first transistor, a second transistor, a third transistor, a first diode-connected transistor, and a capacitor;

wherein each of the plurality of non-volatile memory cells is operatively coupled to a word line (WL), a first control line, a second control line, and a bit line (BL);

wherein the first transistor, second transistor, third transistor, first diode-connected transistor are coupled in series; and wherein the capacitor has a first terminal connected to a common node between the second transistor and the third transistor, and a second terminal connected to the BL.

16. The memory device of claim 15, wherein the first transistor is gated by the WL, the second transistor is gated by the first control line that is also connected to a gate terminal of the first diode-connected transistor, and the third transistor is gated by the second control line.

17. The memory device of claim 15, wherein each of the plurality of memory cells further comprises one or more second diode-connected transistors serially coupled to first the diode-connected transistor.

18. The memory device of claim 15, wherein the first diode-connected transistor is an n-type transistor having a first source/drain terminal and a second source/drain terminal, wherein the first source/drain terminal is connected to the common node through the third transistor, and wherein the first source/drain terminal is not connected to a gate terminal of the first diode-connected transistor and the second source/drain terminal is connected to its gate terminal.

19. The memory device of claim 15, wherein the common node is connected to a first source/drain terminal of the third transistor, with a second source/drain terminal of the third transistor connected to the first diode-connected transistor.

20. The memory device of claim 15, wherein a gate terminal of the first diode-connected transistor is connected to one of the BL, WL, or first control line.

* * * * *